United States Patent [19]
Iguchi et al.

[11] Patent Number: 5,400,293
[45] Date of Patent: Mar. 21, 1995

[54] METHOD OF SETTING ADDRESSES OF MEMORIES

[75] Inventors: Satoru Iguchi; Toshikazu Ito, both of Tokyo; Fumio Sumita, Takasaki, all of Japan

[73] Assignee: Oki Electric Industry Co., Ltd., Tokyo, Japan

[21] Appl. No.: 144,867

[22] Filed: Nov. 3, 1993

[30] Foreign Application Priority Data

Nov. 10, 1992 [JP] Japan .................................. 4-299706

[51] Int. Cl.$^6$ .............................................. G11C 13/00
[52] U.S. Cl. .................. 365/230.03; 365/51; 365/189.01
[58] Field of Search ............ 365/230.01, 230.03, 365/189.01

[56] References Cited

U.S. PATENT DOCUMENTS 4,908,798  3/1990  Urai .................................. 365/230.03

FOREIGN PATENT DOCUMENTS 56-54561A    5/1981  Japan .
57-179984A  11/1982  Japan .
58-3172A     1/1983  Japan .
59-180874A  10/1984  Japan .

Primary Examiner—Terrell W. Fears
Attorney, Agent, or Firm—Spencer, Frank & Schneider

[57] ABSTRACT

A method of installing add-on memories capable of setting continuous addresses over the add-on memories and already existing memories comprises the steps of selecting a desired memory mounting portion among a plurality of memory mounting portions, judging the presence or absence of each memory in the selected memory mounting portion, and setting top and end addresses in the memory mounting portion so that the address of each memory mounted on the selected memory mounting portion continues to addresses of the memories mounted on other memory mounting portions when it is judged that each memory is mounted on the selected memory mounting portion.

4 Claims, 5 Drawing Sheets

METHOD OF SETTING ADDRESSES OF MEMORIES

BACKGROUND OF THE INVENTION

1. Field of the Invention

The present invention relates to a method of installing an add-on memory or add-on memories in a system having a computer, a microprocessor, etc.

2. Description of the Related Art

Workstations, personal computers, peripheral equipment, such as printers, and other various devices having microprocessors are generally provided with substrates having at least minimum memories which are necessary for satisfactory function.

A prior art substrate of this type is provided with a socket to which add-on memories are mounted, or a connector in which a substrate is inserted, for improving the function, performance, and the like, of these devices, so as to install add-on memories therein in case of necessity.

FIG. 4 is a block diagram of a substrate on which memories are mounted. In the same figure, the substrate has a CPU 1 to which an address decoder 7, a ROM 5 and an I/O port 6 are connected by way of an address bus 9. Likewise, the CPU 1 is connected to mounting portions on which RAM chips can be mounted, namely, to RAM sockets #1 to #n (n is an arbitrary positive integer) which are represented by 2, 3 and 4 in FIG. 4.

Chip select lines which are represented by 10, 11, 12, 13 and 14 in FIG. 4 are connected between the address decoder 7 and the RAM sockets, the ROM 5 and the I/O driver 6, so that each of the latter can be arbitrarily selected by the former. A data bus 8 is connected between the CPU 1 and the RAM sockets 2, 3 and 4, ROM 5 and the I/O driver 6.

FIG. 5 is a block diagram of the address decoder 7. The address decoder 7 has decoder circuits, which are represented by 30, 31 and 32 in the figure, corresponding to the RAM chips to be mounted on the RAM sockets 2, 3 and 4. The decoder circuits in the figure by 30, 31 and 32 in the figure definitely determine the RAM chips mounted on the RAM sockets 2, 3 and 4 based on addresses which are inputted thereto by way of the address bus 9.

However, in the prior art substrate, since the addresses corresponding to the RAM chips to be mounted on the RAM sockets 2, 3 and 4 are definitely determined by the decoders 30, 31 and 32, there is a possibility that the addresses are not continuous in some positions where the add-on RAM chips are mounted in case of adding the same.

SUMMARY OF THE INVENTION

It is an object of the invention to provide a method of installing add-on memories capable of setting continuous addresses which cover the add-on memories and the existing memories.

It is another object of the invention to provide a method of installing add-on memories capable of setting continuous addresses which cover the add-on memories and the existing memories even if a RAM chip is mounted on any of a plurality of RAM sockets.

It is further object of the invention to provide a method of installing add-on memories which operate stably without program run away and circuit trouble.

To achieve the above objects, the method of the invention comprises the steps of selecting a desired memory mounting portion among a plurality of memory mounting portions, judging the presence or absence of memory in the selected memory mounting portion and setting top and end addresses in the selected memory mounting portion so that the address may be continuous over the selected memory and other memories when the selected memory mounting portion is judged to carry a memory.

DESCRIPTION OF THE EMBODIMENT

Figure 1:
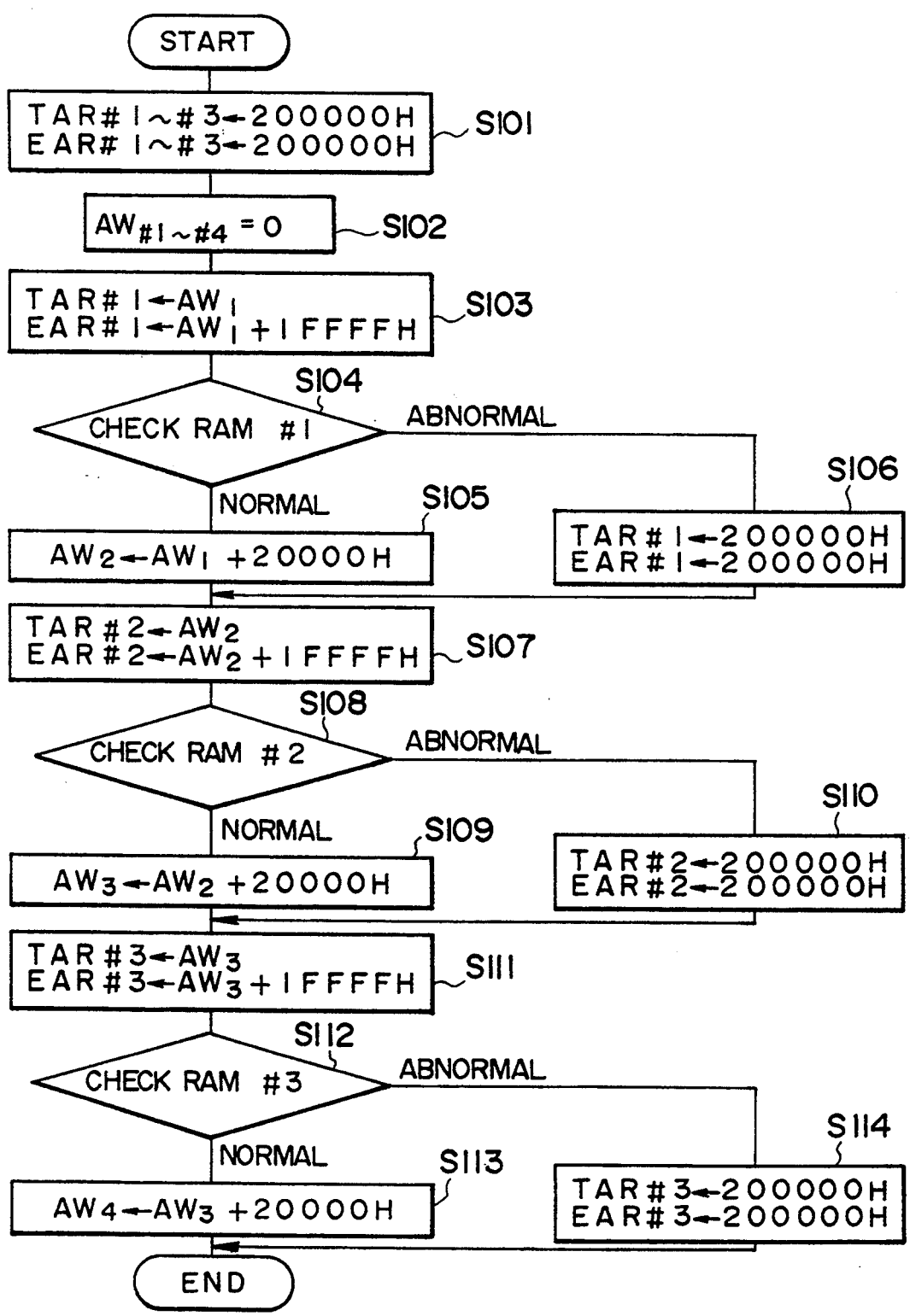
FIG. 1 is a flow chart showing a method of installing add-on memories according to a preferred embodiment of the invention.
Figure 2:
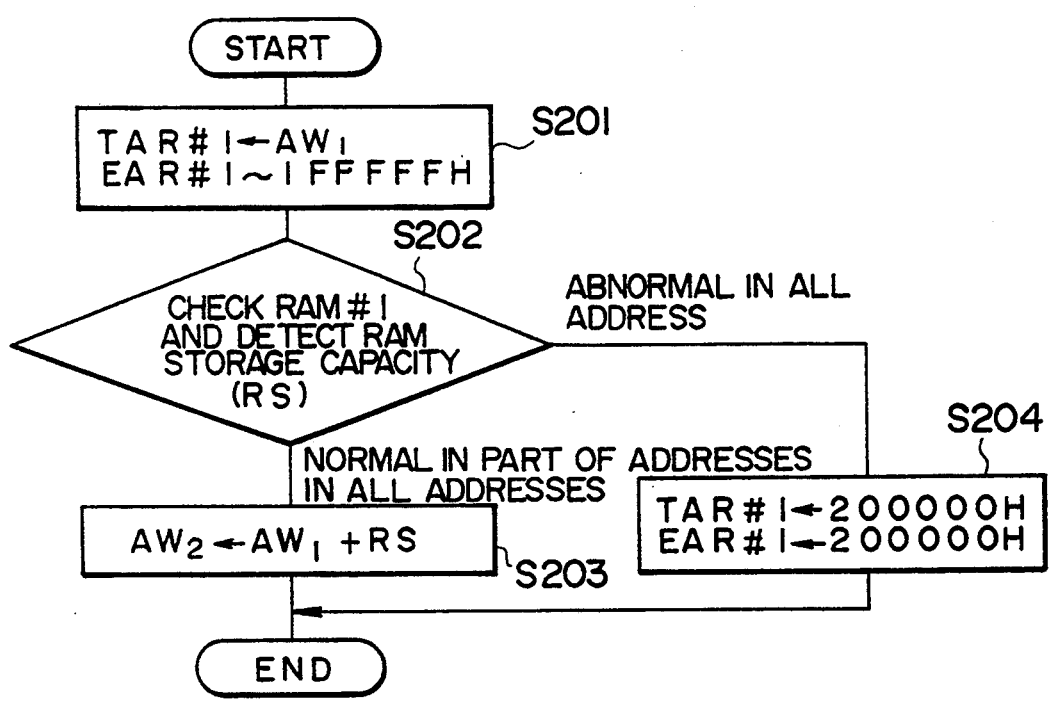
FIG. 2 is a flow chart showing a method of installing add-on memories according to a modification of FIG. 1.

A method of installing add-on memories according to a preferred embodiment of the invention will be described with reference to FIGS. 1 to 3.

Figure 3:
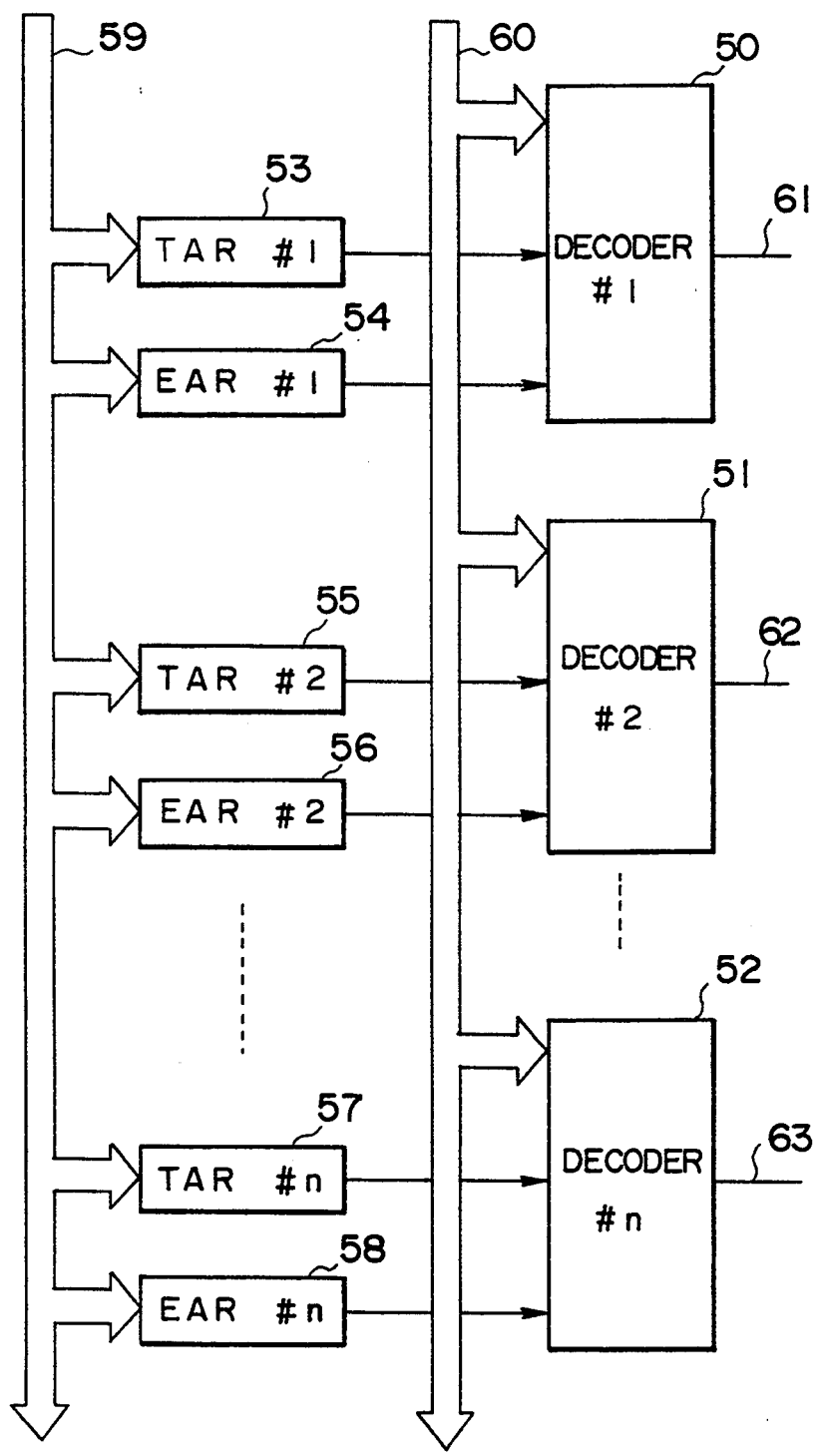
FIG. 3 is a block diagram of the main portion of a substrate on which memories of the invention are mounted.

FIG. 3 is a block diagram showing a main portion of a substrate on which memories are mounted. In the same figure, denoted at 50, 51 and 52 are decoders (n is an arbitrary positive integer) connected to an address bus 60 and to RAM sockets $\#~\#n$ (represented by 2, 3 and 4 in the figure) (n is an arbitrary positive integer) (refer to FIG. 4) by way of chip select lines which are represented by 61, 62 and 63 in the figure.

The decoder $\#_1$ (50) is connected to a top address register $TAR_{\#1}$ (53) for storing a top address therein and an end address register $EAR_{\#1}$ (54) for storing an end address therein while the decoder $\#_2$ (51) is connected to a top address register $TAR_{\#2}$ (55) for storing a top address therein and an end address register $EAR_{\#2}$ (56) for storing an end address therein, and the decoder $\#_n$ (52) is connected to a top address register $TAR_{\#n}$ (57) for storing a top address therein and an end address register $EAR_{\#n}$ (58) for storing an end address therein.

Figure 4:
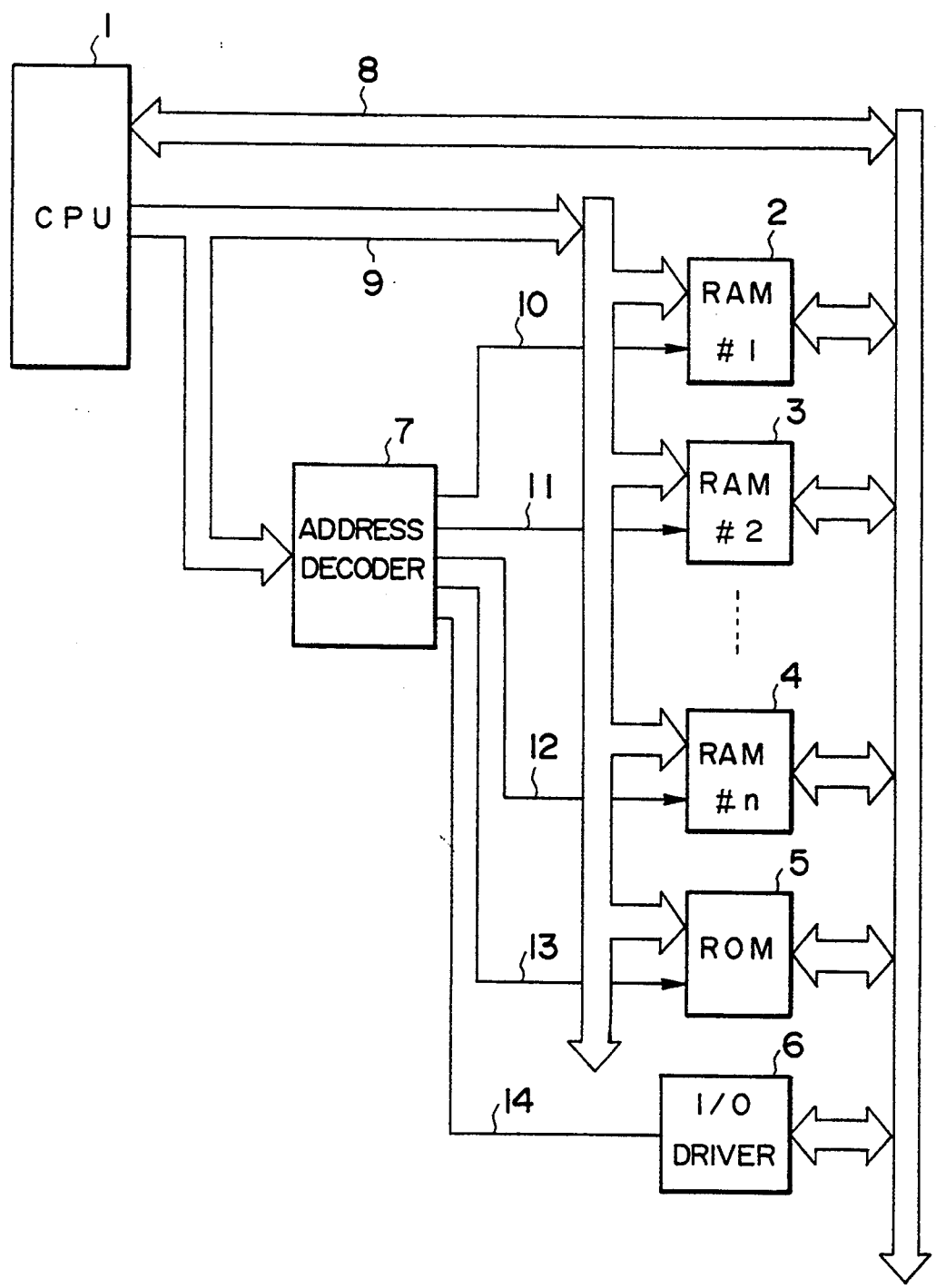
FIG. 4 is a block diagram of a prior art substrate.
Figure 5:
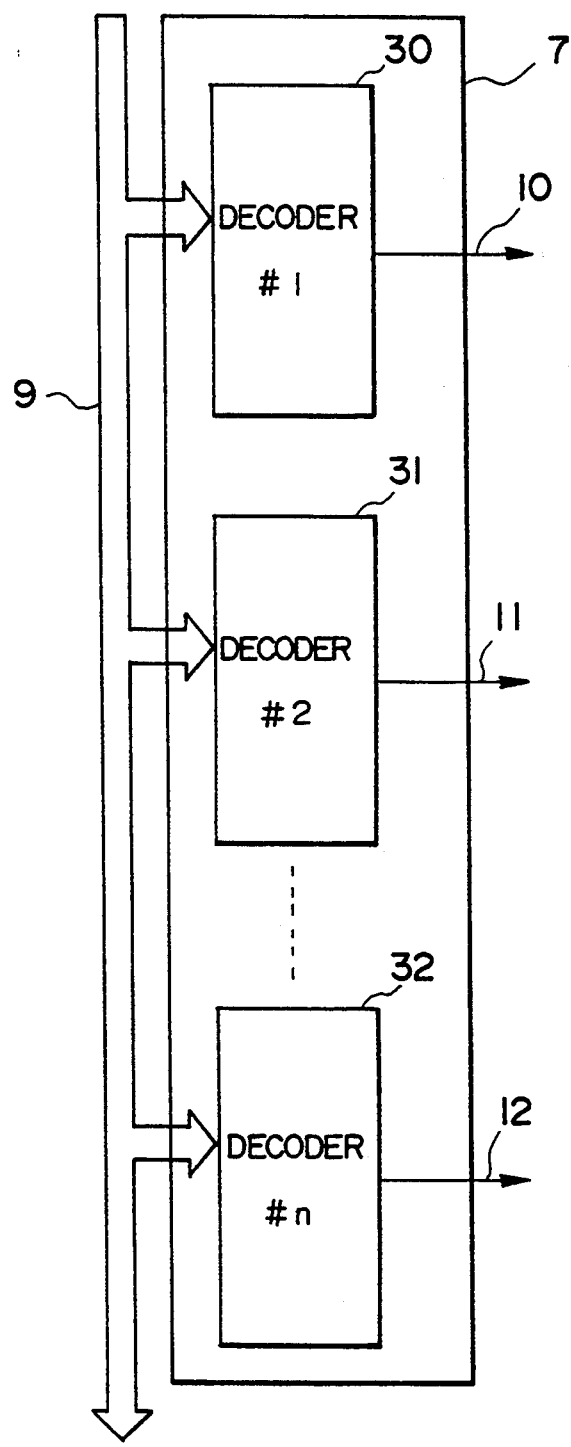
FIG. 5 is a block diagram of an address decoder of the prior art substrate of FIG. 4.

These address registers $TAR_{\#1\sim\#n}$ (represented by 53, 55 and 57 in the figure) and the $EAR_{\#1\sim\#n}$ (represented by 54, 56 and 58 in the figure) are respectively connected to a CPU 1 (refer to FIG. 4) by way of an address bus 59 so that the CPU I sets an arbitrary value in these devices. Since the rest of the substrate of the preferred embodiment is the same in structure as that of the prior art substrate as illustrated in FIG. 4, the explanation thereof is omitted.

A method of installing add-on memories on the substrate having the structure as set forth above will be described hereinafter with reference to FIG. 1. Assume that a storage capacity per RAM chip is 1 megabits (128K bytes) and the number of RAM sockets to be mounted on the substrate is three, namely, the arbitrary positive integer n=3.

A sufficiently large address value, e.g., 200000H (hexadecimal) is set in all the $TAR_{\#1\sim\#n}$ (represented by 53, 55 and 57 in the figure) and the $EAR_{\#1\sim\#n}$ (represented by 54, 56 and 58 in the figure) so that the addresses are not overlapped with one another (Step S101). The sufficiently large address value may be any value if it exceeds an end address value when all the mountable RAM chips are mounted on the substrate, i.e., a value which is a multiple of a storage capacity per RAM chip and the number of the RAM sockets.

Successively, address working variables $AW_{\#1 \sim \#n+i}$ (n is an arbitrary positive integer), which are variables for temporary addresses, are assured in a register of the CPU 1 and 0 is set in the address working $AW_{\#1 \sim \#4}$ (Step S102), since n is 3 according to the preferred embodiment.

Thereafter, a value $AW_1=0$ is set in the $TAR_{\#1}$ (53) corresponding to the RAM socket $\#_1(2)$ while a value $AW_1+1FFFFH$ (hexadecimal digit) corresponding to the size of the RAM chip (128K bytes) to be mounted on the RAM socket $\#_1(2)$ is set in the $EAR_{\#1}$ (54) and addresses $0 \sim 1FFFFH$ are temporarily assigned to the RAM socket $\#_1(2)$ (Step S103).

Successively, a check of the mounting of the RAM chip on the RAM socket $\#_1(2)$ is performed based on a program stored in the ROM 5 (Step S104). As a checking method, supposing that the RAM chip is virtually mounted on the RAM socket $\#_1(2)$, FFH is written in all addresses (as many as 128K bytes) of the RAM chip. The FFH is thereafter sequentially read out from a top address to an end address, thereby judging whether the RAM chip is mounted in the RAM socket$\#_1(2)$ or not based on the fact whether the FFH is read out or not in all addresses.

In a normal case, namely, if the RAM chip is mounted, the addresses of $0 \sim 1FFFFH$ are formally set in the RAM sockets $\#_1(2)$ and $AW_2$ is set in a subsequent address $AW_1+20000H$ which follows the $AW_1+1FFFFH$ (Step S105).

In an abnormal case, namely, if the RAM chip is not mounted, the sufficiently large address value 200000H is set again in the $TAR_{\#1}$ (53) and the $EAR_{\#1}$ (54) so that the addresses are not overlapped with one another (Step S106).

Successively, $AW_2=AW_1+20000H$ is set in the $TAR_{\#2}$ (55) corresponding to the RAM socket $\#_2$ (3) while $AW_2+1FFFFH$ corresponding to the storage capacity (128K bytes) of the RAM chip to be mounted on the RAM socket $\#_2$ (3) is set in the EAR $\#_2$ 56 and addresses $20000 \sim 20000H+1FFFFH$ are temporarily assigned to the RAM socket $\#_2$ (3) (Step S107). Meanwhile, when the RAM chip is not mounted on the RAM socket$\#_1(2)$ in Step S104, 0 is set in the $AW_2$ in Step S107.

Thereafter, a check of the mounting of the RAM chip on the RAM socket $\#_2$ (3) is performed (Step S108). If the result of the check is normal, namely, when the RAM chip is mounted, addresses $20000H \sim 20000H+1FFFFH$ are formally set in the RAM socket $\#_2$ (3) while $AW_3$ is set to be an address $AW_2+20000H$ which follows the $AW_2+1FFFFH$ (Step S109).

In the abnormal case, namely, when the RAM chip is not mounted, the sufficiently large address value 200000H is again set in the $TAR_{\#2}$ (55) and $EAR_{\#2}$ (56) so that the addresses are not overlapped one another (Step S110).

Successively, the $AW_3=AW_2+20000H$ is set in the $TAR_{\#3}$ (57) corresponding to the RAM socket $\#_3$ (4) while $AW_3+1FFFFH$ corresponding to the storage capacity (128K bytes) of the RAM chip to be mounted on the RAM $\#_3$ (4) is set in the EAR $\#_3$ (58) and addresses $40000H \sim 40000H+1FFFFH$ are temporarily assigned to the RAM socket $\#_3(4)$ (Step S111). Whereupon, when the RAM chip is mounted on the RAM socket $\#_1(2)$ but the RAM chip is not mounted on the RAM socket $\#_2$ (3) in Step S108, the address 20000H is set in the $AW_3$ in Step S111. On the other hand, the RAM chip is neither mounted on the RAM socket $\#_1(2)$ nor on the RAM socket $\#_2$ (3), 0 is set in the $AW_3$ in Step 111.

Thereafter, a check of the mounting of the RAM chip on the RAM socket $\#_3$ (4) is performed (Step S112). If the result of check is normal, namely, when the RAM chip is mounted, the addresses $40000H \sim 40000H+1FFFFH$ are formally set in the RAM socket $\#_3$ (4) while $AW_4$ is set to be an address $AW_3+20000H$ which follows $AW_3+1FFFFH$ (Step 113).

On the other hand, in the abnormal case, namely, when the RAM chip is not mounted, the sufficient large address value 200000H is set again in both the TAR $\#_3$ (57) and EAR $\#_3$ (58) so that the addresses are not overlapped with one another (Step S114).

A method of installing add-on memories is described with reference to FIG. 2 when the storage capacity of the RAM chip is arbitrary.

Firstly, the value $AW_1=0$ is set in the TAR $\#_1$ (53) corresponding to the RAM socket $\#_1(2)$ following the Step S102 while the value of $AW_1+1FFFFH$ is set in the EAR $\#_1$ (54) on the assumption that the RAM chip to be mounted on the RAM socket $\#1(2)$ has the maximum storage capacity, e.g. 16 megabits (2 megabytes) and the addresses of $0 \sim 1FFFFH$ are temporally assigned to the RAM socket $\#_1(2)$ (Step S201).

Successively, a check of the mounting of the RAM chip on the RAM socket $\#_1(2)$ is performed in the same way as set forth above while an actual storage capacity of the RAM chip is detected (Step S202). In detecting the storage capacity, when the check of the mounting of the RAM chip is normally completed, the storage capacity is calculated based on the end address at that time while when the check is interrupted by error, namely, the checking result is abnormal, the storage capacity is calculated based on an address which is positioned immediately before the address where the check is interrupted by error. According to the address modification of the preferred embodiment, since the value $AW_1+1FFFFH$ is set in the $EAR_{\#1}$ (54) on the assumption that the RAM chip having 1 megabit (128K bytes) has 16 megabit (2 megabyte) capacity, check is interrupted by error, so that the storage capacity is calculated based on the address which is positioned immediately before an address where the check is interrupted by error. When the check of the RAM chip in all the addresses or a part of the addresses indicates normal, the storage capacity of the RAM chip (RS) is detected based on the address checked at that time, whereby addresses $0 \sim RS$ are formally set in the RAM socket (2) and the $AW_2$ is set to be $AW_1+RS$ (Step S203).

On the other hand, when the check indicates abnormal, namely, when the RAM chip is not mounted, the sufficiently large address value 200000H is set in the $TAR_{\#1}$ (53) and $EAR_{\#1}$ (54) so that the addresses are not overlapped with one another (Step S204).

Thereafter, the same process is performed likewise for the RAM sockets $\#_2(3)$, $\#_3(4)$.

Although the preferred embodiment is explained with reference to the RAM chips, it is a matter of course that the present invention is not limited to the RAM chips but can be applied to a computer system in which an add-on ROM for character font, etc., can be installed.

What is claimed is:

1. A processor implemented method of setting addresses of memories in a processing system having a plurality of memory mounting portions each for mounting a respective memory having a predetermined memory address capacity therein, the method comprising:

selecting a memory mounting portion;

initially storing a top address and an end addresses of the selected memory mounting portion in an associated top address register and an associated end address register, respectively;

determining the presence or absence of memory in the selected memory mounting portion by writing a given value to addresses of the memory from the top address to the end address, and attempting a reading out of the given value from the addresses written to, wherein the presence of a memory in the selected memory mounting portion is determined by a successful reading out of the given value from all addresses written to, and wherein the absence of a memory in the selected memory mounting portion is determined by an unsuccessful reading out of the given value from all addresses written to; and if the absence of memory in the selected memory mounting portion is determined:

then storing an address value exceeding a combined memory capacity of the system in both the top and end address registers of the selected memory mounting portion; wherein the above steps are performed for each memory mounting portion of the system in turn;

wherein the respective top address initially stored for a successive memory mounting portion is the end address plus one of a next preceding memory mounting portion determined to have memory present, and wherein the end address initially stored for a successive memory mounting portion is the respective top address plus the respective predetermined memory address capacity of the memory to be mounted therein; and wherein a continuous address range is set for memories in the memory mounting portions of the system.

2. A processor implemented method of setting addresses of memories in a system having a plurality of memory mounting portions each for mounting a respective memory having a predetermined memory address capacity the method comprising:

selecting a memory mounting portion among the plurality of memory mounting portions;

detecting the presence or absence of memory in the selected memory mounting portion;

setting top and end addresses in top and end address registers associated with the selected memory mounting portion based on the detecting step; and repeating the above steps for each memory mounting portion in the system;

wherein the setting of top and end addresses is executed so that addresses are continuous over each selected memory mounting portion having memory therein, and are continuous between memory mounting portions having memory mounted therein; and wherein the end address for a respective memory mounting portion is determined during the detecting step by detecting the memory address capacity of the memory mounted therein.

3. A method as claimed claim 1, wherein the step of determining comprises:

writing the given value in the memory by addresses corresponding to a predetermined virtual storage capacity, detecting the presence of memory in the memory mounting portion when the given value is read out from all or a portion of the addresses of the virtual storage capacity, and calculating the actual storage capacity of the memory mounted in the memory mounting portion during the step of detecting.

4. A method as claimed in claim 3, wherein the predetermined virtual storage capacity is sufficiently larger than the actual storage capacity so that the virtual storage capacity exceeds an end address value when all the memory mounting portions contain memory, whereby no overlapping of addresses can occur.

* * * * *